United States Patent [19]

Lee

[11] Patent Number: 5,001,481
[45] Date of Patent: Mar. 19, 1991

[54] MOS TRANSISTOR THRESHOLD COMPENSATION CIRCUIT

[75] Inventor: Swye N. Lee, Lawrenceville, N.J.

[73] Assignee: David Sarnoff Research Center, Inc., Princeton, N.J.

[21] Appl. No.: 472,135

[22] Filed: Jan. 30, 1990

[51] Int. Cl.⁵ .............................................. H03M 1/06
[52] U.S. Cl. .................................. 341/136; 341/118; 323/316; 340/767; 358/236; 307/296.8
[58] Field of Search ............... 341/118, 119, 120, 133, 341/134, 135, 136, 144, 150, 153; 323/315, 316, 317; 340/767, 793, 811, 812; 358/236, 241; 307/296.1, 296.8, 491

[56] References Cited

U.S. PATENT DOCUMENTS

| | | | |
|---|---|---|---|
| 3,651,517 | 3/1972 | Kurek et al. | 341/136 |
| 4,180,807 | 12/1979 | Eichelberger et al. | 341/136 |
| 4,184,152 | 1/1980 | Mukawa | 341/136 |
| 4,250,493 | 2/1981 | Kihara et al. | 341/136 |
| 4,250,494 | 2/1981 | Butler et al. | 341/136 |
| 4,638,241 | 1/1987 | Colles | 341/136 |
| 4,652,872 | 3/1987 | Fujita | 358/241 X |
| 4,814,688 | 3/1989 | Colles | 341/144 X |
| 4,827,260 | 5/1989 | Sugawa et al. | 341/144 |
| 4,873,516 | 10/1989 | Castleberry | 340/812 X |
| 4,914,440 | 4/1990 | Ramet | 341/140 |
| 4,951,041 | 8/1990 | Inada et al. | 340/767 |

FOREIGN PATENT DOCUMENTS 54-153559  3/1979  Japan ..................................... 341/136

*Primary Examiner*—A. D. Pellinen
*Assistant Examiner*—H. L. Williams
*Attorney, Agent, or Firm*—W. J. Burke

[57] ABSTRACT

A circuit that compensates for threshold voltage variations in a large array of deposited thin film MOS transistors includes a threshold voltage compensation transistor for a subset of the deposited analog thin film transistors having a prescribed source to gate threshold voltage. The source electrode of the threshold voltage compensation transistor receives a voltage corresponding to the maximum threshold voltage in the large array. The gate and drain electrodes of the threshold voltage compensation transistor are connected together and to one terminal of a capacitor. The other terminal of the capacitor is connected to a second voltage and the capacitor is momentarily discharged to set the threshold voltage compensation transistor gate and drain electrodes to the second voltage. The gate and drain electrodes of the threshold voltage compensation transistor are connected to the gate electrodes of the subset of analog thin film transistors. As a result, the source to gate voltages of the analog transistors over the large array are independent of their threshold values.

37 Claims, 2 Drawing Sheets

MOS TRANSISTOR THRESHOLD COMPENSATION CIRCUIT

This invention was made with Government support under Contract No. F3361588-C-1825 awarded by the Department of the Air Force. The Government has certain rights in this invention.

FIELD OF THE INVENTION

The invention relates to apparatus employing MOS transistors and more particularly to threshold compensation arrangements for thin film MOS transistors in panel displays.

BACKGROUND OF THE INVENTION

In many types of circuits employing MOS transistors, the variations in threshold voltage among the transistors must be accurately controlled to insure proper operation. U.S. Pat. No. 4,180,807, issued to Charles W. Eichelberger et al. Dec. 25, 1979, for example, discloses a charge transfer circuit in which the magnitude of charge packets transferred via metal-oxide-semiconductor (MOS) transistors varies as a function of the difference between the threshold voltages of the transistors. A significant threshold voltage difference causes errors in the charge packet transfer. Such threshold voltage differences in the charge transfer circuit are minimized by arranging the threshold sensitive transistors in close proximity.

Flat panel displays using liquid crystal display (LCD) or similar devices may include thin film MOS transistors deposited on the glass substrate of the LCD. While there is threshold voltage variation in bulk type MOS transistors such as used in the aforementioned U.S. Pat. No. 4,180,807, the variation is limited by the small size of the integrated circuit structure. A LCD display is significantly larger and the threshold variations in thin film transistors over the larger surface are much greater. As larger size panel displays with more gray scale levels are developed, the variation of the characteristics of the thin film transistors over the panel tends to increase. To obtain gray scale variation in an LCD type display, an analog voltage is impressed on the LCD. Attaining larger number of gray scale values, however, is severely limited by the capability of thin film transistors in analog circuitry with respect to threshold voltage related characteristics, subthreshold slope and carrier mobility.

As is well known in the art, accurate LCD displays utilize the conversion of digital data into an analog signal that is impressed across a light varying medium. The digital to analog conversion, however, has required accurate or well matched devices. The variation of threshold related thin film transistor characteristics has made it difficult to provide useful digital to analog converters over the extensive surface of a large panel display. Dependency on such threshold voltage characteristics has been avoided through the use of high speed gray scale counters or complicated high speed clock and control signal arrangements. But such alternative circuitry is more complex, requires a higher transistor count and results in lower wafer yield. The present invention provides accurate threshold voltage compensation for a large number of transistors in a large area circuit such as an array of digital to analog converters in a liquid crystal display.

SUMMARY OF THE INVENTION

The invention is directed to a circuit adapted to compensate for threshold voltage variations in MOS transistors of a large array that includes a threshold voltage compensation transistor for a group of transistors having a prescribed source to gate threshold voltage. The source electrode of the threshold voltage compensation transistor receives a voltage corresponding to the maximum threshold voltage in the array. The gate and drain electrodes of the threshold voltage compensation transistor are connected together and to one terminal of a capacitor. The other terminal of the capacitor is connected to a second voltage and the capacitor is momentarily discharged to set the threshold voltage compensation transistor gate and drain electrodes to the second voltage. The gate and drain electrodes of the threshold voltage compensation transistor are coupled to the gate electrodes of the group of analog thin film transistors whereby the voltages at the gate electrodes of the MOS transistors over the large array are substantially the same.

In accordance with one aspect of the invention, a switching transistor is connected across the capacitor to momentarily connect the gate and drain electrodes of the threshold voltage compensating transistor to the second voltage.

In an illustrative embodiment of the invention, a system for displaying a plurality of n bit digital codes on an array of pixels includes a plurality of pixel driver circuits. Each pixel driver generates an analog signal in response to one of the n bit digital codes and includes a set of n constant current source transistors which exhibit a prescribed source to gate threshold voltage within a predetermined range of a maximum threshold voltage over the array. A threshold voltage compensating transistor exhibiting a source to gate threshold voltage substantially equal to the prescribed source to gate threshold voltages of the set of n constant current source transistors receives a voltage corresponding to the maximum of the predetermined range of the source to gate threshold voltages of the plurality of pixel drivers at its source electrode. The drain and gate electrodes of the threshold voltage compensating transistor are connected in common and to one terminal of a capacitor. The other terminal of the capacitor is connected to a second voltage and the capacitor is initially discharged to set the voltage at the source and drain electrodes of the threshold voltage compensating transistor. The gate and drain electrodes of the threshold compensating transistor are coupled to the gate electrode of each of the n first transistors. By setting the source electrodes of the threshold voltage compensation transistors over the array to the maximum threshold voltage therein, the gate electrodes of all the constant current source transistors of the plurality of pixel drivers is maintained at the same voltage.

The invention will be better understood from the following more detailed description taken with the accompanying drawings and claims.

DETAILED DESCRIPTION

Figure 1:
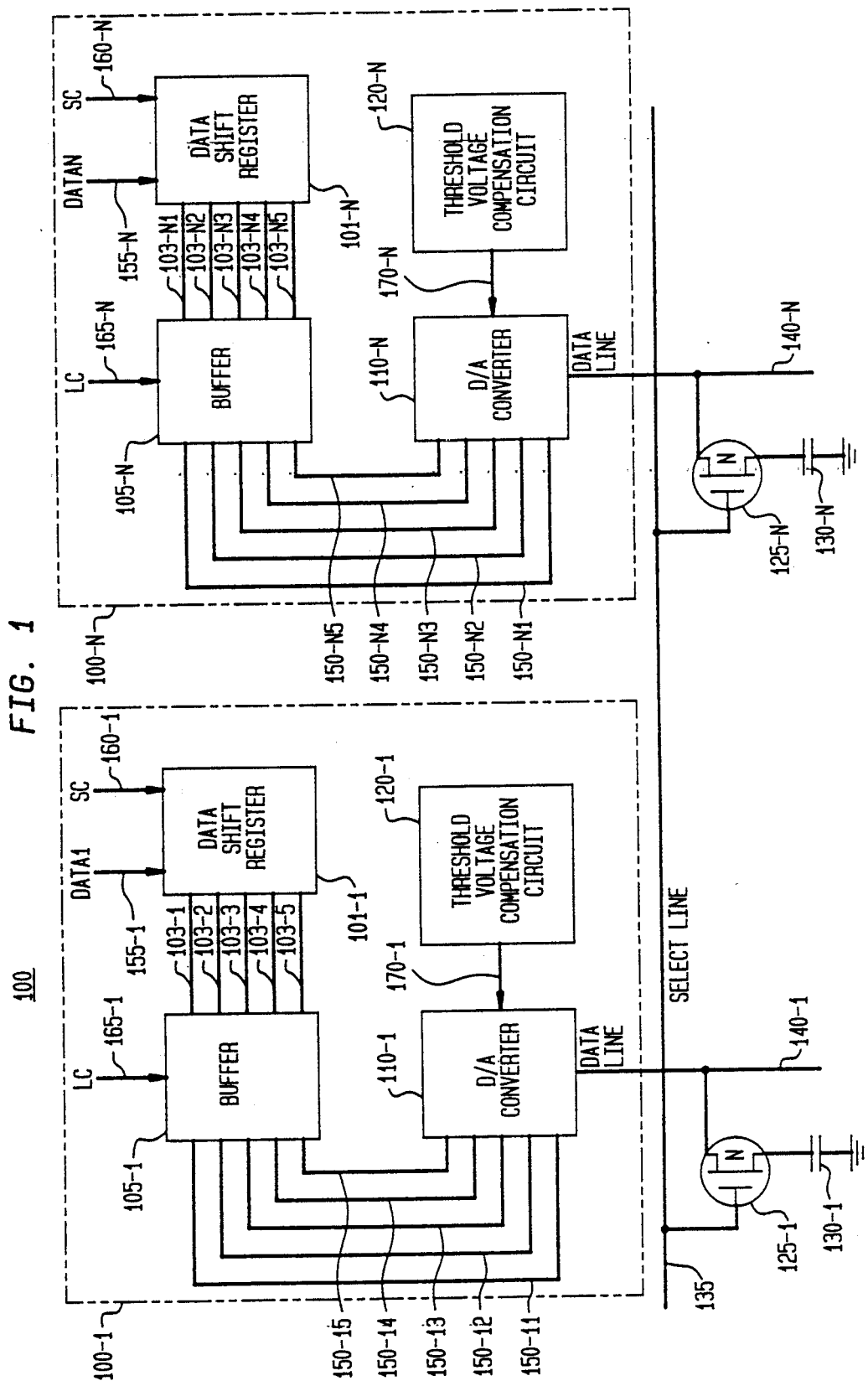
FIG. 1 is a block and schematic diagram of a display driver arrangement using threshold voltage compensation for digital to analog conversion in accordance with the present invention.

Referring now to FIG. 1, there is shown a display driver arrangement 100 for a plurality of pixel capacitors 130-1 through 130-N over a large display area (e.g., 3 inches) in accordance with the invention. The display driver arrangement 100 comprises drivers 100-1 through 100-N shown as dashed rectangles, n-channel pixel transistors 125-1 through 125-N, a select line 135 and data lines 140-1 through 140-N. The driver 100-1 comprises a data shift register 101-1, a data buffer register 105-1, a data converter (digital-to-analog converter, D/A Converter) 110-1 and a threshold voltage compensation circuit 120-1. The driver 100-N comprises a data shift register 101-N, a data buffer register 105-N, data converter (digital-to-analog converter, D/A Converter) 110-N and a threshold voltage compensation circuit 120-N. Additional drivers 100-2 through 100-N-1 substantially identical to drivers 100-1 and 100-N are not shown but are indicated by the dashed line between drivers 100-1 and 100-N.

An input of the data shift register 101-1 receives a data input DATA1 on a lead 155-1 and a shift clock input SC on a lead 160-1. Outputs 103-1, 103-2, 103-3, 103-4 and 103-5 of data shift register 101-1 are coupled to the inputs of data buffer register 105-1 via leads (conductors) 101a. The buffer register 105-1 receives a load clock signal LC on a lead 165-1. Outputs of buffer register 105-1 on leads 150-11, 150-12, 150-13, 150-14 and 150-15 are coupled to the data inputs of the digital-to-analog converter 110-1 and the output of threshold voltage compensation circuit 120-1 is coupled to a compensation input of digital to analog converter 110-1 through lead 170-1.

An input of the data shift register 101-N receives a data input DATAN on a lead 155-N and a shift clock input SC on a lead 160-N. Outputs 103-N1, 103-N2, 103-N4 and 103-N5 of the data shift register 101-N are coupled to inputs of the data buffer register 105-N. Buffer register 105-N receives a load clock signal LC on lead 165-N. The outputs of buffer register 105-N on leads 150-N1, 150-N2, 150-N3, 150-N4 and 150-N5 are coupled to the data inputs of digital to analog converter 110-N and the output of threshold voltage compensation circuit 120-N is coupled to the compensation input of digital to analog converter 110-N through lead 170-N.

Driver 100-1 is coupled to data line 140-1 which in turn is coupled to the drain electrode of n-channel pixel transistor 125-1. The source electrode of transistor 125-1 is coupled to one terminal of pixel capacitor 130-1 and the gate electrode of transistor 125-1 is coupled to a pixel select line 135. The driver 100-N is coupled to a data line 140-N and the data line 140-N is coupled to the drain electrode of n-channel pixel transistor 125-N. The source electrode of transistor 125-N is coupled to a pixel capacitor 130-N and the gate electrode of transistor 125-N is coupled to the pixel select line 135.

The driver 100-1 converts an incoming digital signal DATA1 into an analog signal and supplies the analog signal to data line 140-1. The analog signal from data line 140-1 is applied to the drain electrode of pixel transistor 125-1 and to other pixel transistors (not shown) connected to the data line. Transistor 125-1 is enabled by a high voltage level signal at its gate electrode at particular time intervals. The analog signal is then applied to pixel capacitor 130-1 to determine level of light seen at the corresponding pixel of the display. Similarly, driver 100-N converts the incoming digital signal DATAN into an analog signal which is coupled to the drain electrode of pixel transistor 125-N and to other pixel transistors (not shown) connected to the data line through line 140-N. Transistor 125-N is enabled by a high voltage level logical one signal at its gate electrode at the same times as transistor 125-1 so that the analog signal corresponding to signal DATAN is applied to pixel capacitor 130-1 through transistor 125-N to determine the level of light seen at the corresponding pixel of the display. Display drivers 100-2 through 100-N-1 (not shown) serve to control the light intensities of other pixels in the same manner.

In operation, the signal DATA1 supplied to the data input of shift register 101-1 on lead 155-1 is shifted into the register under control of shift clock signal SC on lead 160-1. When the data corresponding to a particular pixel is stored in shift register 101-1, it is transferred to buffer register 105-1 under control of load clock signal LC on lead 165-1. The data in buffer register 105-1 corresponds to the gray scale value of the pixel to be displayed at capacitor 125-1. If, for example, the data stored for black is 00000 and all the outputs of buffer register 105-1 are logical zeros, i.e. high voltage level signals. The data stored for white is 11111 and all the outputs of buffer register 105-1 are logical ones, i.e. low voltage level signals. Intermediate gray scale digital codes in buffer register 105-1 fall between the black and white digital codes.

The outputs of buffer register 105-1 on leads 150-11, 150-12, 150-13, 150-14 and 150-15 are coupled to the data inputs of digital to analog converter 110-1. Digital to analog converter 110-1 produces an analog signal that controls the selected pixels along data line 140-1. The analog signal corresponds to the digital code from buffer register 105-1 and may for example range from zero volts for black to 5 volts for white. Threshold voltage compensation circuit 120-1 is employed to compensate for variations in threshold voltages of MOS transistors used in digital to analog converter 110-1. Driver 100-N operates in a manner substantially similar to that described with respect to driver 100-1 to provide an analog signal for the pixels along data line 140-N.

The pixels in a large LCD type displays may extend over a large area. The driver circuits comprise thin film transistors deposited on the glass substrate of the display. Consequently, the threshold characteristics of the thin MOS transistors vary significantly from one end of the substrate to the other (e.g., by 30%). Digital circuits such as data shift register 101-1 and data buffer register 105-1 may be constructed to avoid the effects of threshold voltage variations. Analog circuits such as may be used to convert the digital code from buffer register 105-1 to an accurate gray scale analog signal, however, are generally dependent on the threshold characteristics of the transistors therein.

Figure 2:
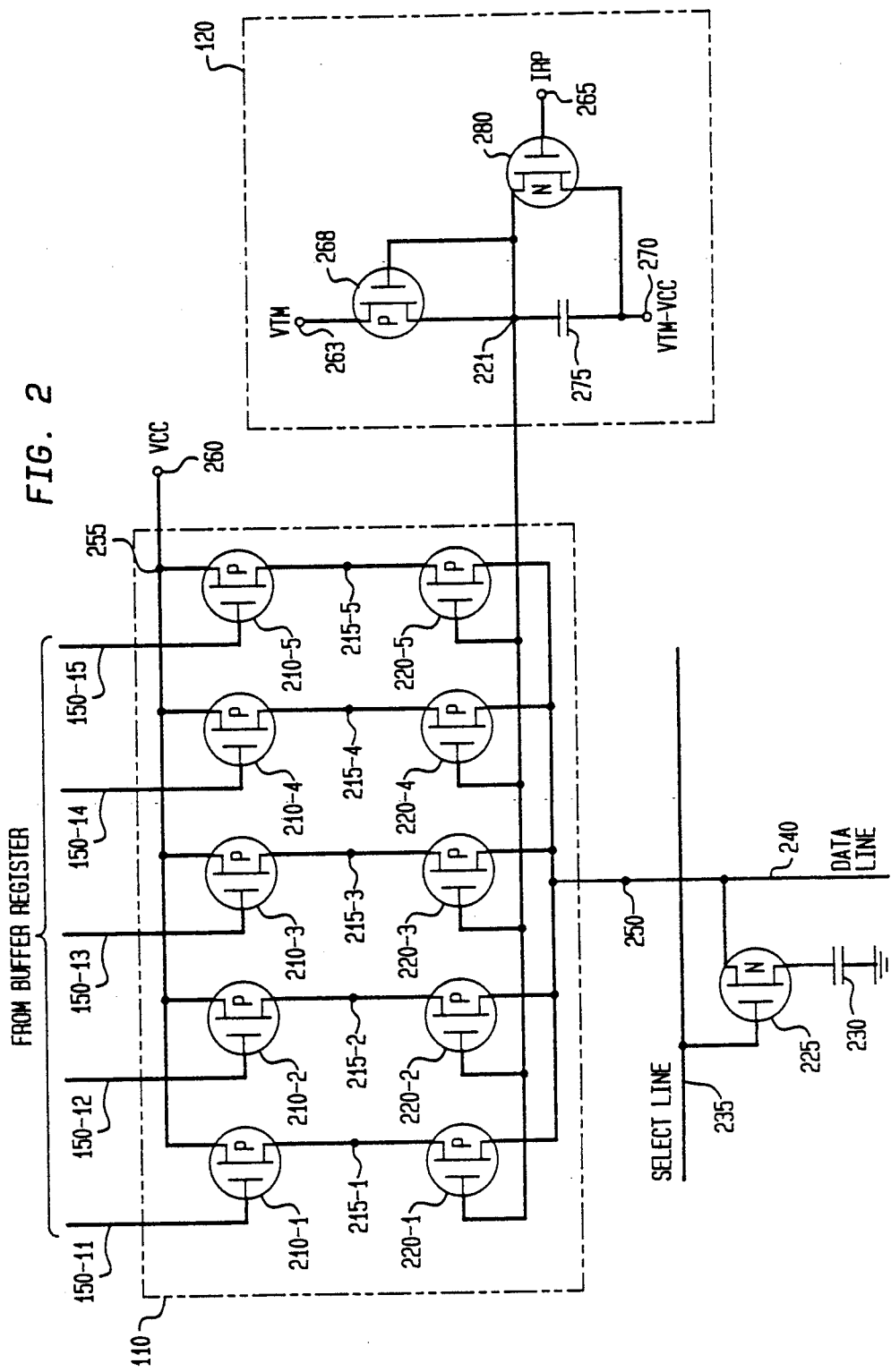
FIG. 2 is a schematic diagram of a digital to analog converter and a threshold voltage compensation circuit in accordance with the present invention.

Referring now to FIG. 2, there is shown a schematic diagram of a circuit 110 that may be used as the digital to analog converter 110-1 or 110-N in FIG. 1 and a voltage compensation circuit 120 in accordance with the present invention. The circuit 110 comprises an digital to analog converter 110 (shown in a dashed rectangle), threshold compensation circuit 120 (shown in a dashed rectangle), an n-channel pixel transistor 225, a capacitor 230, a select line 235 and a data line 240. The digital to analog converter 110 comprises p-channel MOS transistors 210-1, 210-2, 210-3, 210-4, 210-5, 220-1, 220-2, 220-3, 220-4 and 220-5. Threshold voltage compensation circuit 120 comprises a p-channel transistor 268, an n-channel transistor 280, a capacitor 275, a positive voltage supply source 255 and a negative voltage supply source 270. In a preferred embodiment the transistors in FIG. 2 are thin film transistors deposited on the substrate of a liquid crystal display. Each of the transistors has a gate electrode, a source electrode and a drain electrode.

The source electrodes of p-channel transistors 210-1, 210-2, 210-3, 210-4 and 210-5 are connected to a voltage source VCC at terminal 260. The gate electrode of transistor 210-1 is coupled to lead 150-11. The gate electrode of transistor 210-2 is coupled to lead 150-12. The gate electrode of transistor 210-3 is coupled to lead 150-13. The gate electrode of transistor 210-4 is coupled to lead 150-14. The gate electrode of transistor 210-5 is coupled to lead 150-15. Leads 150-11 through 150-15 are connected to respective digital signal outputs of buffer register 105-1 in FIG. 1. The drain electrode of transistor 210-1 is coupled to the source electrode of transistor 220-1 and to a node 215-1. The drain electrode of transistor 210-2 is coupled to the source electrode of transistor 220-2 and to a node 215-2. The drain electrode of transistor 210-3 is coupled to the source electrode of transistor 220-3 and to a node 215-3. The drain electrode of transistor 210-4 is coupled to the source electrode of transistor 220-4 and to a node 215-. The drain electrode of transistor 210-5 is coupled to the source electrode of transistor 220-5 and to a node 215-5.

The drain electrodes of transistors 220-1, 220-2, 220-3, 220-4 and 220-5 are coupled to a node 250 and to a data line 240 which is further coupled to the drain electrode of pixel transistor 225-1. The gate electrodes of transistors 220-1, 220-2, 220-3, 220-4 and 220-5 are coupled to the gate and drain electrodes of transistor 268 of threshold voltage compensation circuit 220-1. The source electrode of transistor 268 is connected to a positive supply voltage VTM at terminal 263. The gate and drain electrodes of transistor 268 are coupled together to one terminal the capacitor 275, to the drain electrode of transistor 280, to the gate electrodes of transistors 220-1, 220-2, 220-3, 220-4 and 220-5 and to a terminal 221. The source electrode of transistor 280 is coupled to a second terminal of the capacitor 275, to a terminal 270 and to a negative voltage supply source VTM−VCC. The gate electrode of transistor 280 is coupled to a terminal 265 to which is applied an initial reset pulse IRP.

In operation, digital-to-analog converter 110 in FIG. 2 receives the outputs of a buffer register, e.g. 105-1 of FIG. 1, on leads 150-11 through 150-15. When a gray scale digital code is available at the output of buffer register 105-1, the digital signals on leads 150-11 through 150-15 are coupled to the gate electrodes of Transistors 210-1 through 210-5, respectively. Transistor 210-1 is enabled (turned on or biased to conduction) when its gate electrode receives a low voltage level signal, i.e. a logical one that exceeds its source to gate threshold voltage. Upon being enabled, the voltage at the drain electrode of transistor 210-1 changes to +VCC. Similarly, transistors 210-2 through 210-5 are enabled by logical one signals on their gate electrodes.

Transistors 220-1 through 220-5 in FIG. 2 operate as constant current sources. Transistors 220-1 through 220-5 are constructed to provide different predetermined currents to node 250 when connected to voltage source +VCC through transistors 210-1 through 210-5, respectively. Lead 150-11 couples the least significant, i.e. $2^0$ bit of the gray scale code from buffer register 105-1 to the gate electrode of transistor 210-1 and transistor 210-1 conducts a current I when transistor 210-1 is enabled. Lead 150-12 couples the $2^1$ bit of the gray scale code from buffer register 105-1 to the gate electrode of transistor 210-2 and transistor 220-2 conducts a current 2I when transistor 210-2 is enabled by a logical one at its gate electrode. Lead 150-13 couples the $2^2$ bit of the gray scale code from buffer register 105-1 to the gate electrode of transistor 210-3 and transistor 210-3 conducts a current 4I when transistor 210-3 is enabled by a logical one at its gate electrode. Lead 150-14 couples the $2^3$ bit of the gray scale code from buffer register 105-1 to the gate electrode of transistor 210-4 and transistor 220-4 conducts a current 8I when transistor 210-4 is enabled by a logical one at its gate electrode. Lead 150-15 couples the most significant, i.e. $2^5$, bit of the gray scale code from buffer register 105-1 to the gate electrode of transistor 210-5 and transistor 220-5 conducts a current 16I when transistor 210-5 is enabled by a logical one at its gate electrode. The currents from transistors 220-1 through 220-5 are summed at node 250 and the resultant current is supplied to the drain electrode of pixel transistor 225-1.

The digital to analog converter 110-1 employing the constant current source arrangement of FIG. 2 is simpler and more economical than high speed gray scale counters used in the prior art. It is important, however, that the drain currents of transistors 220-1 through 220-5 in FIG. 2 do not deviate from their predetermined values. As is well known in the art, the drain current of an MOS transistor is $$ID = K(Vgs - Vt)^2$$

where Vgs is the source to gate voltage of the transistor, Vt is the source to gate threshold voltage of the transistor and K is a constant related to the physical properties of the transistor. In FIG. 2, the sum of the drain currents from transistors 220-1 through 220-5 charges pixel capacitance 230-1 through transistor 225-1 and determines the brightness of the pixel. Similar circuits determine the brightness at the other pixel locations in the display. As is apparent from equation 1, variations in thin film transistor threshold voltage can cause deviations in the predetermined currents from transistors 220-1 through 220-5. While such threshold voltage variations in one digital to analog circuit are small, the thin film transistor threshold voltage variations in a large area display may result in noticeable differences in pixel brightness over the display. In accordance with the present invention, the threshold voltage compensation circuit 120-1 in FIG. 2 modifies the biasing of the transistors in the digital to analog converter 110-1 to avoid brightness variations over a large area display due to differences in thin film transistor threshold voltage.

In the threshold voltage compensation circuit 120-1 shown in FIG. 2, the positive voltage terminal 263 is set to the maximum threshold voltage, i.e., VTM, of the thin film transistors in the display driver circuits 100-1 through 100-N of FIG. 1. Voltage VTM is derived from measurements of the thin film transistors in the display as is well known in the art. The source electrode of threshold compensation transistor 268 is thereby fixed at the maximum threshold voltage VTM. The drain and gate electrodes of transistor 268 are coupled to negative voltage terminal 270 through capacitor 275. The negative voltage terminal 270 is set to the voltage VTM−VCC where VCC is the voltage applied to the source electrodes of transistors 210-1 through 210-5 from supply terminal 260.

When the display of FIG. 1 is turned on, transistor 280 is enabled (biased to conduction) by a momentary positive pulse applied to its gate electrode from terminal 265. Capacitor 275 is thereby discharged through transistor 280 and the drain and gate electrodes of transistor 268 are initially set to the voltage VTM−VCC. Transistor 268 then conducts until the gate source voltage of transistor 268 is equal to its threshold value Vt. The voltage at the drain and gate electrodes of transistor 268 and at the gate electrodes of transistors 220-1 through 220-5 is then set to VTM−Vt. Since transistors 220-1 through 220-5 and threshold compensation transistor 268 are part of the same driver circuit, they are in close proximity and have substantially the same threshold voltage Vt. Consequently, the drain current of each of transistors 220-1 through 220-5 does not vary as a function of its threshold voltage. Since each driver has its own threshold compensation circuit, the drain currents of constant current source transistors in driver circuit 100-1 in FIG. 1 are the same as the drain currents of the constant current transistors in driver circuits 100-2 through 100-N although the threshold voltages of the constant current source transistors may vary considerably e.g. by 30% over the substrate.

Consider, for example, the operation of transistors 210-1 and 220-1 the digital to analog converter 110 in FIG. 2. When the least significant bit of gray scale code signal provides a logical one signal to the gate electrode of transistor 210-1, transistor 210-1 is turned on and the voltage at its drain electrode and at the source electrode of transistor 220-1 is raised to VCC. The gate electrode of transistor 220-1 is set to the voltage at the drain and gate electrodes of threshold voltage compensation transistor 268 i.e. VTM−Vt. The voltage at the gate of source of transistor 220-1 is VTM−Vt while the voltage at the source of transistor 220-1 is VCC. The source to gate voltage of transistor 220-1 is then VCC−(VTM−Vt) and the drain current of transistor 220-1 is $$I = K(Vgs - Vt)^2 = K(VCC - VTM)^2$$

which is independent of the threshold voltage Vt of transistor 220-1. The same analysis applies to transistors 220-2 through 220-5 and to all constant current transistors in the driver circuits 100-1 through 100-N of FIG. 1 so that uniform results are obtained over a large area display substrate regardless of the variations of transistor threshold voltages over the substrate.

It is to be understood that the specific embodiments described herein are intended merely to be illustrative of the spirit and scope of the invention. Modifications can readily be made by those skilled in the art consistent with the principles of this invention. For example, the invention may be employed in digital to analog converter circuits for purposes other than displays and in other circuits where threshold voltage compensation is needed.

What is claimed is:

1. Circuitry comprising:
   a field effect transistor having a gate and first and second output terminals;
   a capacitor having a first terminal coupled to the gate, to the first output terminal of the transistor, and to a circuitry output terminal, and having a second terminal coupled to a circuitry first voltage supply terminal;
   means for selectively coupling the first and second terminals of the capacitor together such that a voltage applied to the second terminal of the capacitor selectively appears on the first terminal of the capacitor; and
   the second output of the transistor being coupled to a circuitry second voltage supply terminal.

2. The circuitry of claim 1 wherein the coupling means comprises a second field effect transistor having a gate and first and second output terminals with the gate being coupled to a circuitry initial reset terminal, and with the first and second outputs being coupled to the first and second terminals, respectively, of the capacitor.

3. The circuitry of claim 2 wherein the first transistor is of a first conductivity type and the second transistor is of the opposite conductivity type.

4. The circuitry of claim 3 wherein the first transistor is a p-channel field effect transistor and the second transistor is an n-channel field effect transistor.

5. The circuitry of claim 4 wherein the transistors are metal-oxide-semiconductor transistors.

6. The circuitry of claim 5 wherein the transistors are silicon transistors.

7. The circuitry of claim 6 wherein the transistors are thin field transistors.

8. The circuitry of claim 4 wherein the circuitry output terminal is adapted to be coupled to the gates of a plurality of p-channel transistors which are coupled to a third voltage supply terminal.

9. The circuitry of claim 8 wherein:
   the third voltage supply terminal being coupled to a first voltage source, and with each of the plurality of p-channel transistors having a threshold voltage with the maximum threshold voltage of these transistors being the voltage of a second voltage source which is coupled to the first voltage supply terminal of the circuitry; and
   a third voltage source having a voltage equal to the maximum threshold voltage of the plurality of p-channel transistors less the voltage of the first voltage source.

10. In combination:
    a plurality of n circuits each comprising a field effect transistor, a capacitor, and a means for selectively coupling first and second terminals of the capacitor together;
    each of the transistors of the circuits having a gate and first and second outputs;
    the gate of each of the transistors of the circuits being coupled to the first output thereof, to the first terminal of the capacitor, and to a circuit output terminal;
    a plurality of n groups of field effect transistors of the same conductivity type as the transistors of the circuits, each of the plurality of n group transistors being coupled to a first voltage supply terminal;
    the output terminal of each circuit being coupled to a gate of each of the transistors of a separate one of the n groups of transistors;
    each circuit being located near the group of transistors it has its output terminal coupled to with threshold voltage levels of the transistors of the group and the transistor of the circuit coupled thereto being relatively closely matched;

the second output of each transistor of the circuits being coupled to a second voltage supply terminal; and the second terminals of each of the capacitors being coupled to a third voltage supply terminal.

11. The combination of claim 10 wherein:

the first voltage supply terminal is coupled to a first voltage source having a first output voltage level;

the second voltage supply terminal is coupled to a second voltage source which has a second voltage level that is essentially equal to the threshold voltage of the transistor of the n groups which has the highest threshold voltage; and the third voltage supply terminal is coupled to a third voltage source which has a third output voltage which is equal to the threshold voltage of the transistor of the n groups which has the highest threshold voltage less the first voltage level.

12. Circuitry comprising:

a plurality of substantially identical converter circuits with each circuit having a separate compensation circuit coupled thereto;

each converter circuit comprises first and second pluralities of n field effect transistors with each transistor having a gate and first and second outputs;

the first output of each transistor of the first plurality of transistors being coupled to a first output of a separate one of the transistors of the second plurality of transistors;

the gates of the transistors of the first plurality of transistors being coupled to circuitry input terminals;

the gates of the transistors of the second plurality of transistors being coupled to an output of the compensation circuits;

the second outputs of the second plurality of transistors being coupled to a circuitry output terminal;

the second outputs of the first plurality of transistors being coupled to a first voltage supply terminal;

each compensation circuit comprises a field effect transistor having a gate and first and second outputs, a capacitor having first and second terminals, and means for selectively coupling the first and second terminals of the capacitor together;

the first output of the transistor of the compensation circuit being coupled to the gate thereof and to the first terminal of the capacitor;

the second output of the transistor of the compensation circuit being coupled to a second voltage supply terminal which is adapted to be coupled to a first voltage source which generates a voltage level which is substantially equal to the highest threshold voltage of the transistors of the second plurality of transistors of the converter circuits; and the second terminal of the capacitor being couple to a third voltage terminal which is adapted to be coupled to a third voltage source which generates an output voltage level substantially equal to the highest threshold voltage of the transistors of the second plurality of transistors of the converter circuits less the voltage of a voltage source applied to the first voltage supply terminal.

13. A threshold voltage compensation circuit comprising:

a field effect transistor having a gate electrode and first and second output electrodes;

first and second voltage receiving means;

the first output electrode of the transistor being coupled to the first voltage receiving means;

the second output electrode of the transistor being coupled to the gate electrode of the transistor;

capacitor means connected between the second output electrode of the transistor and the second voltage receiving means; and means connected across the capacitor means for momentarily connecting the second output and gate electrodes of the transistor to the second voltage receiving means.

14. The circuit of claim 13 further comprising:

means for receiving a momentary signal; and wherein the means for momentarily coupling the second output and gate electrodes of the transistor to the second voltage receiving means comprises:

semiconductor switching means having a control electrode and first and second output electrodes;

the first output electrode of the semiconductor switching means being coupled to the gate and second output electrodes of the transistor;

the second electrode of the semiconductor switching means being coupled to the second voltage receiving means; and the control electrode of the semiconductor switching means being coupled to the means for receiving the momentary signal.

15. The circuit of claim 14 wherein:

the semiconductor switching means comprisies:

a second field effect transistor having a gate electrode and first and second output electrodes;

the first electrode of the semiconductor switching means comprising the first output electrode of the second transistor;

the second electrode of the semiconductor switching device comprising the second output electrode of the second transistor; and the control electrode of the semiconductor switching means comprising the gate electrode of the second transistor.

16. The circuit of claim 15 wherein the first transistor is a p-channel field effect transistor and the second transistor is an n-channel field effect transistor.

17. The circuit of claim 16 wherein the transistors are metal-oxide-semiconductor transistors.

18. The circuit of claim 16 wherein the first and second transistors are thin film transistors.

19. A threshold voltage compensated metal-oxide-semiconductor transistor circuit comprising:

at least one first metal-oxide-semiconductor field effect transistor having a source electrode, a drain electrode, and a gate electrode and exhibiting a prescribed source to gate threshold voltage within a predetermined range of a maximum threshold voltage;

a terminal for receiving a first voltage;

means for connecting the terminal for receiving the first voltage to the source electrode of the first MOS transistor;

a second metal-oxide-semiconductor field effect transistor having a source electrode, a drain electrode and a gate electrode and exhibiting a source to gate threshold voltage substantially equal to the prescribed source to gate threshold voltage of the at least one first MOS transistor;

a terminal for receiving a voltage substantially equal to the maximum of the predetermined range;

a terminal for receiving a second voltage;

means for connecting the terminal for receiving the voltage substantially equal to maximum of the predetermined range to the source electrode of the MOS second transistor;

the drain and gate electrodes of the second MOS transistor being connected together;

capacitor means having first and second terminals;

the first terminal of the capacitor means being connected to the drain electrode of the second transistor;

means for connecting the terminal for receiving the second voltage to the second terminal of the capacitor means;

means for momentarily connecting the first terminal of the capacitor means to the terminal for receiving the second voltage; and means for coupling the gate and drain electrodes of the second transistor to the gate electrode of the first transistor.

20. The circuit of claim 19 wherein the second voltage is substantially equal to the maximum of the predetermined range less the first voltage.

21. The circuit of claim 20 further comprising:

means for receiving a momentary signal; and wherein the means for momentarily connecting the first terminal of the capacitor means to the terminal for receiving the second voltage comprises:

a third metal-oxide-semiconductor field effect transistor having a source electrode, a drain electrode and a gate electrode;

the drain electrode of the third transistor being coupled to the gate and drain electrodes of the second transistor;

the source electrode of the third transistor being coupled to the terminal for receiving the second voltage; and the gate electrode of the third transistor being coupled to the means for receiving the momentary signal.

22. The circuit of claim 21 wherein the first and second transistors are p-channel transistors and the third transistors is an n-channel transistor.

23. The circuit of claim 22 wherein the first, second and third transistors are thin film transistors.

24. In a circuit for converting an n bit digital code to an analog signal, an arrangement comprising:

a set of n first transistors each having a source electrode, a drain electrode, and a gate electrode and each exhibiting a prescribed source to gate threshold voltage within a predetermined range of a maximum threshold voltage;

means responsive to each bit of the n bit digital code for generating a first voltage;

a terminal for receiving a second voltage; means for applying the first voltage corresponding to the nth bit of the digital code to the source electrode of the nth first transistor;

a threshold voltage compensating transistor having a source electrode, a drain electrode and a gate electrode and exhibiting a source to gate threshold voltage substantially equal to the prescribed source to gate threshold voltage of the n first transistors;

means for receiving a voltage equal to the maximum of the predetermined range of the source of gate threshold voltages;

means for connecting the terminal for receiving the voltage equal to the maximum of the predetermined range source to gate threshold voltages the set of n first transistors to the source electrode of the threshold voltage compensating transistors;

the drain and gate electrodes of the threshold voltage compensating transistor being connected together;

capacitor means having first and second terminals;

the first terminal of the capacitor means being connected to the gate and drain electrodes of the threshold voltage compensating transistor;

means for connecting the terminal for receiving the second voltage to the second terminal of the capacitor means;

means for momentarily coupling the first terminal of the capacitor means to the terminal for receiving the second voltage; and means for coupling the gate and drain electrodes of the threshold compensating transistor to the gate electrode of each of the n first transistors.

25. The circuit of claim 24 further comprising:

means for receiving a momentary signal; and wherein the means for momentarily connecting the first terminal of the capacitor means to the terminal for receiving the second voltage comprises:

a switching transistor having a source electrode, a drain electrode and a gate electrode;

the drain electrode of the switching transistor being connected to the gate and drain electrodes of the threshold voltage compensating transistor;

the source electrode of the switching transistor being connected to the terminal for receiving the second voltage; and the gate electrode of the switching transistor being connected to the means for receiving the momentary signal.

26. The circuit of claim 25 wherein each of the n first transistors is a p-channel metal-oxide-semiconductor transistor, the threshold voltage compensating transistor is a p-channel metal-oxide-semiconductor field effect transistor and the switching transistor is an n-channel metal-oxide-semiconductor field effect transistor.

27. The circuit of claim 26 wherein each of the p-channel first transistors, the p-channel threshold voltage compensating transistor, and the n-channel switching transistor is a thin film transistor.

28. The circuit of claim 26 wherein the second voltage is substantially equal to the maximum of the predetermined range of the source to gate threshold voltages less the first voltage.

29. The circuit of claim 24 wherein the drain electrodes of the n first transistors are connected together.

30. The circuit of claim 29 wherein each of the n first transistors, $n=1, 2, \ldots N$ is constructed to produce a predetermined current $2^n I$ at its drain electrode in response to the first voltage applied to its source electrode.

31. A system for displaying a plurality of n bit digital codes on an array of pixels comprising:

a plurality of pixel driver circuits each including means responsive to one of the n bit digital codes for generating an analog signal;

each pixel driver circuit comprising:

a set of n constant current source transistors each having a source electrode, a drain electrode, and a gate electrode and each exhibiting a prescribed source to gate threshold voltage within a predetermined range of the maximum source to gate threshold voltage of the plurality of driver circuits;

means responsive to each bit of the n bit digital code for generating a first voltage;

a terminal for receiving a second voltage;

a terminal for receiving a second voltage;

means for applying the first voltage corresponding to the nth bit of the digital code to the source electrode of the nth first transistor;

a threshold voltage compensating transistor having a source electrode, a drain electrode and a gate electrode and exhibiting a source to gate threshold voltage substantially equal to the prescribed source to gate threshold voltage of the n first transistor;

means for receiving a voltage corresponding to the maximum of the predetermined range of the source to gate threshold voltages of the plurality of pixel drivers;

means for connecting the means for receiving the voltage corresponding to the maximum of the predetermined range of the source to gate threshold voltages of the plurality of driver circuits to the source electrode of the threshold voltage compensating transistor;

the drain and gate electrodes of the threshold voltage compensating transistor being connected together;

capacitor means having first and second terminals;

the first terminal of the capacitor means being connected to the gate and drain electrodes of the threshold voltage compensating transistor;

means for connecting the terminal for receiving the second voltage to the second terminal of the capacitor means;

means for momentarily coupling the first terminal of the capacitor means to the terminal for receiving the second voltage; and means for coupling the gate and drain electrodes of the threshold compensating transistor to the gate electrode of each of the n first transistors.

32. The circuit of claim 31 further comprising:

means for receiving a momentary signal; and wherein the means for momentarily connecting the first terminal of the capacitor means to the terminal for receiving the second voltage comprises:

a switching transistor having a source electrode, a drain electrode and a gate electrode;

the drain electrode of the switching transistor being connected to the first terminal of the capacitor means;

the source electrode of the switching transistor being connected to the terminal for receiving the second voltage; and the gate electrode of the switching transistor being connected to the means for receiving the momentary signal.

33. The circuit of claim 32 wherein each of the n first transistors is a p-channel metal-oxide-semiconductor field effect transistor, the threshold voltage compensating transistor is a p-channel metal-oxide-semiconductor transistor and the switching transistor is an n-channel metal-oxide-semiconductor field effect transistor.

34. The circuit of claim 33 wherein each of the transistors is a thin film transistor.

35. The circuit of claim 33 wherein the drain electrodes of the n first transistors are connected together.

36. The circuit of claim 35 wherein each of the n first transistors, n=1, 2, ... N, is constructed to produce a predetermined current $2^n I$ at its drain electrode in response to the first voltage applied to its source electrode.

37. The circuit of claim 31 wherein the second voltage is substantially equal to the maximum of the predetermined range of the source to gate threshold voltages of the plurality of pixel drivers less the first voltage.

* * * * *